United States Patent
Kerber et al.

(10) Patent No.: US 9,324,822 B2
(45) Date of Patent: Apr. 26, 2016

(54) GATE DIELECTRIC PROTECTION FOR TRANSISTORS

(71) Applicant: GLOBALFOUNDRIES Inc., Grand Cayman (KY)

(72) Inventors: Andreas Kerber, Mount Kisco, NY (US); Suresh Uppal, Clifton Park, NY (US); Salvatore Cimino, Clifton Park, NY (US); Hao Jiang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/321,679

(22) Filed: Jul. 1, 2014

(65) Prior Publication Data
US 2016/0005828 A1    Jan. 7, 2016

(51) Int. Cl.
| | | |
|---|---|---|
| *H01L 29/00* | (2006.01) | |
| *H01L 21/00* | (2006.01) | |
| *H01L 29/423* | (2006.01) | |
| *H01L 21/66* | (2006.01) | |
| *H01L 29/08* | (2006.01) | |
| *H01L 21/28* | (2006.01) | |
| *H01L 21/762* | (2006.01) | |
| *H01L 29/06* | (2006.01) | |
| *H01L 29/49* | (2006.01) | |
| *H01L 29/66* | (2006.01) | |
| *H01L 29/78* | (2006.01) | |
| *G01R 31/26* | (2014.01) | |

(52) U.S. Cl.
CPC ...... *H01L 29/42364* (2013.01); *G01R 31/2621* (2013.01); *H01L 21/28035* (2013.01); *H01L 21/76224* (2013.01); *H01L 22/30* (2013.01); *H01L 29/0653* (2013.01); *H01L 29/0847* (2013.01); *H01L 29/4916* (2013.01); *H01L 29/66568* (2013.01); *H01L 29/78* (2013.01)

(58) Field of Classification Search
CPC ............... H01L 29/4234; H01L 29/66833; H01L 29/792; H01L 29/42364; H01L 29/0847; H01L 29/4916; H01L 29/0653; H01L 29/66568; H01L 29/78; H01L 22/30; H01L 21/28035; H01L 21/76224
See application file for complete search history.

(56) References Cited

U.S. PATENT DOCUMENTS

| | | | | |
|---|---|---|---|---|
| 5,789,933 | A  * | 8/1998 | Brown et al. | 324/762.02 |
| 2004/0212016 | A1* | 10/2004 | Yasui et al. | 257/365 |
| 2007/0045230 | A1* | 3/2007 | Keller et al. | 216/81 |
| 2007/0057281 | A1* | 3/2007 | El-Kareh et al. | 257/133 |

* cited by examiner

*Primary Examiner* — Victor A Mandala
*Assistant Examiner* — Quovaunda V Jefferson
(74) *Attorney, Agent, or Firm* — Williams Morgan, P.C.

(57) ABSTRACT

At least one method, apparatus and system disclosed herein involves forming a device comprising a transistor comprising an active gate and at least one inactive gate in parallel to the active gate. A source region on a substrate is formed. An active gate region is formed on the substrate adjacent the source region. A drain region is formed on the substrate adjacent the active gate region. A first inactive gate region is formed on the substrate in parallel to the active gate region. The source region, the drain region, the active gate region, and the first inactive gate region comprise the transistor. The first inactive gate region is capable of dissipating the at least a portion of a charge.

16 Claims, 11 Drawing Sheets

FIGURE 11
(Standard Layout)

FIGURE 12
(Embodiment Layout)

GATE DIELECTRIC PROTECTION FOR TRANSISTORS

BACKGROUND OF THE INVENTION

1. Field of the Invention

Generally, the present disclosure relates to the manufacture of sophisticated semiconductor devices, and, more specifically, to various methods and structures for reducing charges induced by external factors, such as plasma processing.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another.

Various processes are performed on semiconductor substrates in manufacturing integrated circuit products. Some of these processes may be plasma based processing. For example, plasma processing in semiconductor manufacturing may include chemical vapor deposition (CVD), etching, dry cleaning (instead of wet chemical rinsing), etc. Plasma processing involves creating partially ionized gas by applying an electric filed. Ions can be accelerated, resulting ion bombardment of a wafer surface. This bombardment provides for plasma etching by direct means (sputtering, ion beam milling) or by indirect means by assisting chemical etching. Generally, positive ion-electron pairs are created by ionization reactions, however, accumulation of charges generally occur when using plasma processing. These charges may cause damage to circuits (e.g., transistors) formed on semiconductor wafers.

When integrated circuits are formed, tests are performed to determine the correctness in the operation of the circuits. For electrical testing of a discrete transistor (e.g., field effect transistor (FET)), the gate, source, and drain of the transistor are typically connected to probe pads. In order to reduce plasma processing induced damage of gate dielectric during the fabrication process or in the testing process, protection diodes are typically connected in parallel to the transistor.

Figure 1:
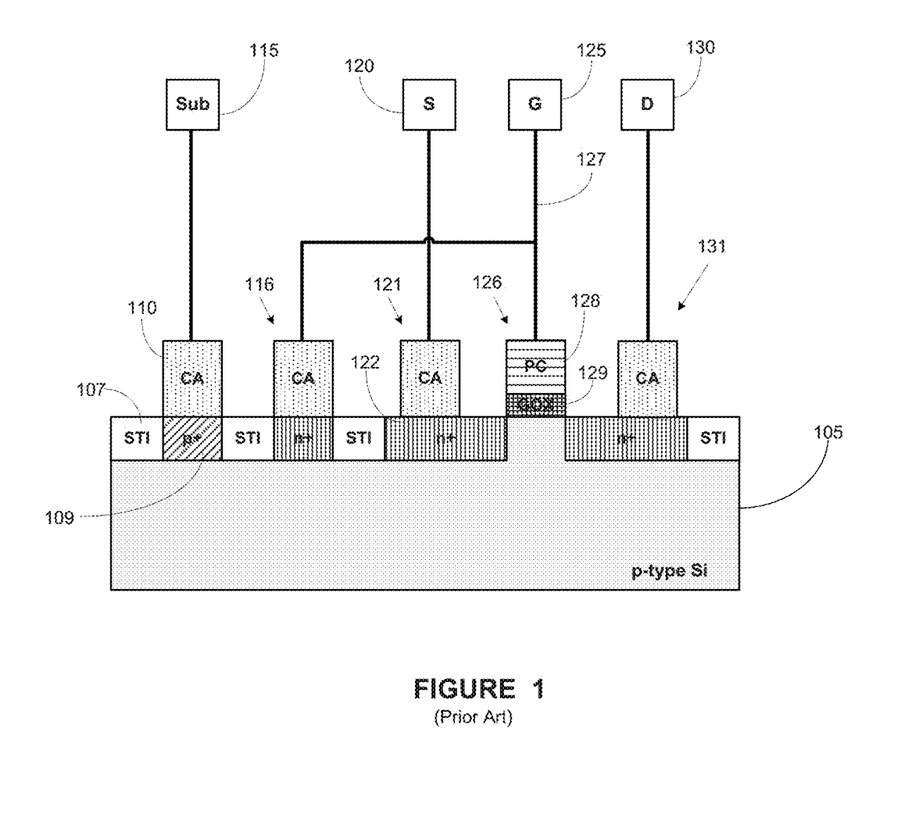
FIG. 1 depicts a stylized depiction of a prior art integrated circuit device comprising a transistor.

Turning now to FIG. 1, a stylized depiction of a prior art integrated circuit device is illustrated. FIG. 1 illustrates a field-effect transistor (FET) that is formed on a substrate 105, e.g., a p-type silicon substrate. Various shallow trench isolation (STI) 107 regions are formed. In many cases the STI regions 107 are formed using oxide depositions on the substrate 105. A p+ doped region 109, as well as n+ doped regions 122 are formed are formed on the substrate 105. A polysilicon conductor (PC) 128 may be formed above a gate oxide region (GOX) 129 on the substrate 105 to form the gate region 126 of the FET. In some embodiments, the polysilicon conductor (PC) may be replaced with a metal conductor. That is, in some embodiments, PC may refer to the gate electrode, wherein in other embodiments, PC may refer to a metal conductor operating as a gate electrode. A contact region (CA) 110 may be formed above the doped n+ region for a source region 121. Similarly, another CA 110 may be formed above an n+ region for a drain region 131.

Further, a CA 110 may be formed above another n+ region and another CA 110 may be formed above the p+ doped region 109. Together, p+ region 109 and the n+ region provide for a PN junction for forming a diode region 116. A test substrate pad 115 may be connected to the contact 110, which may form a circuit connection to the anode terminal of the diode 116. A test pad 120 may be connected to the source 121, a test pad 125 may be connected to the gate 126, and a test pad 130 may be connected to the drain of the transistor. The circuit provided by the structure illustrated in FIG. 1 is depicted in FIG. 2.

Figure 2:
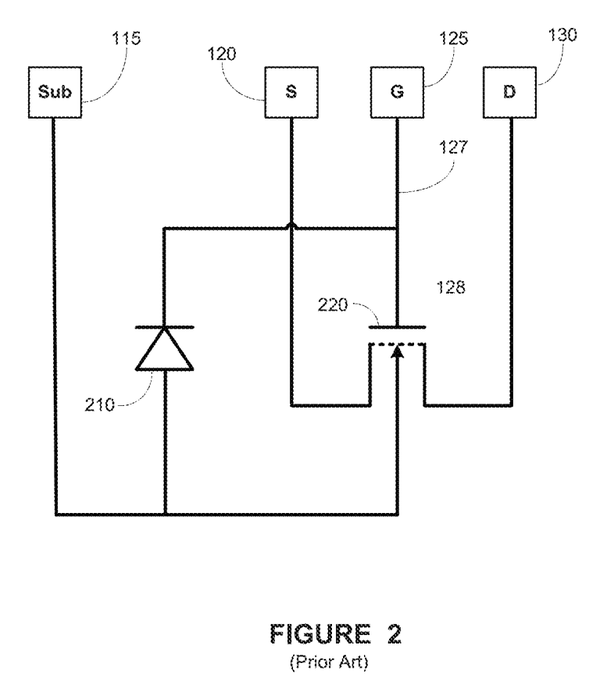
FIG. 2 illustrates a stylized, equivalent prior art circuit diagram of the structure of FIG. 1.

FIG. 2 illustrates a stylized prior art circuit diagram of the structure provided by the structure of FIG. 1. As described above, the structure of FIG. 1 comprises a transistor that is connected to a diode formed to provide protection from plasma process charges, as described above. The structure of FIG. 1 comprises a gate 220 and protection diode 210 that is connected to the gate node 127, such that the diode 210 is connected in parallel to the gate 220. The protection diode 210 is used to reduce the plasma processing-induced charge damage of the gate dielectric during the fabrication process. One of the problems associated with the prior art solution using the protection diode includes diode leakage problems. When performing testing of the transistor, measuring gate leakage may become inaccurate due to the diode leakage. Further, any variations in the pitch of the formations during processing can lead to significant diode leakage using the state of the art process.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a device comprising a transistor comprising an active gate and at least one inactive gate in parallel to the active gate. A source region on a substrate is formed. An active gate region is formed on the substrate adjacent the source region. A drain region is formed on the substrate adjacent the active gate region. A first inactive gate region is formed on the substrate in parallel to the active gate region. The source region, the drain region, the active gate region, and the first inactive gate region comprise the transistor. The first inactive gate region is capable of dissipating at least a portion of a charge.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide a protection circuit for reducing or dissipating charge from external sources (e.g., charge from plasma processing) in an integrated circuit (e.g., transistor). Embodiments herein provide one or more inactive, "dummy," or "phantom" gates for a transistor, wherein such gates may be capable of dissipating charge experienced by the transistor. In some embodiments, the inactive gates may be formed in parallel to the active gate of the transistor. In one embodiment, the term "active" gate refers to the gate that operates with source and drain to form a transistor.

The inactive/dummy gates provide protection for the circuitry and/or the dielectric portions of the transistor. The transistor may experience external charge from one or more of a number of sources (e.g., external electrical field, plasma charge from plasma processing, etc.). The inactive gates may be capable of dissipating parasitic charges. As an example, plasma charge may leak into the substrate through the active and inactive gates. The inactive gates may comprise equivalent capacitances that may be capable of providing discharge capability for discharging charges caused by external sources, e.g., charges from plasma processing. Embodiments herein provide for utilizing equivalent capacitor(s) from inactive/dummy gate(s) in place of a protection diode for dissipating charges from external sources.

Further, embodiments herein provide for more flexible antenna rules. For example, embodiments herein provide for a flexible ratio for the signal line of the gate of a transistor. Antenna rules are provided to express the allowable ratio of metal area to gate area. The ratio is based on the total metal connected to the gate without connections to the source and the drain, to the amount of gate area. In some embodiments, the antenna ratio is a function of the amount of metal connection to the gate of a transistor and the gate oxide area. Utilizing the inactive/dummy gate provided by embodiments herein, the antenna ratio may be defined by Equation 1:

$$\text{Ant. Ratio} = (\text{Metal Connc. to gate})/(\text{active gate} + \text{dummy gate oxide area}); \qquad \text{Eq. 1}$$

wherein the antenna ratio for a transistor may be adjusted based upon the number of dummy or inactive gates. The antenna ratio (ant. Ratio) of Equation 1 equals to the amount of metal connection to the gate divided by the total gate area, which includes the sum of the active gate area and the dummy gate regions. That is, the greater the number of dummy or inactive gates, the greater the flexibility with regard to the antenna ratio. In one embodiment, the antenna ratio may be specified in terms of impedance. Using embodiments herein, transistors may be formed with a predetermined number of inactive/dummy gates to accommodate a predetermined antenna ratio.

Figure 3:
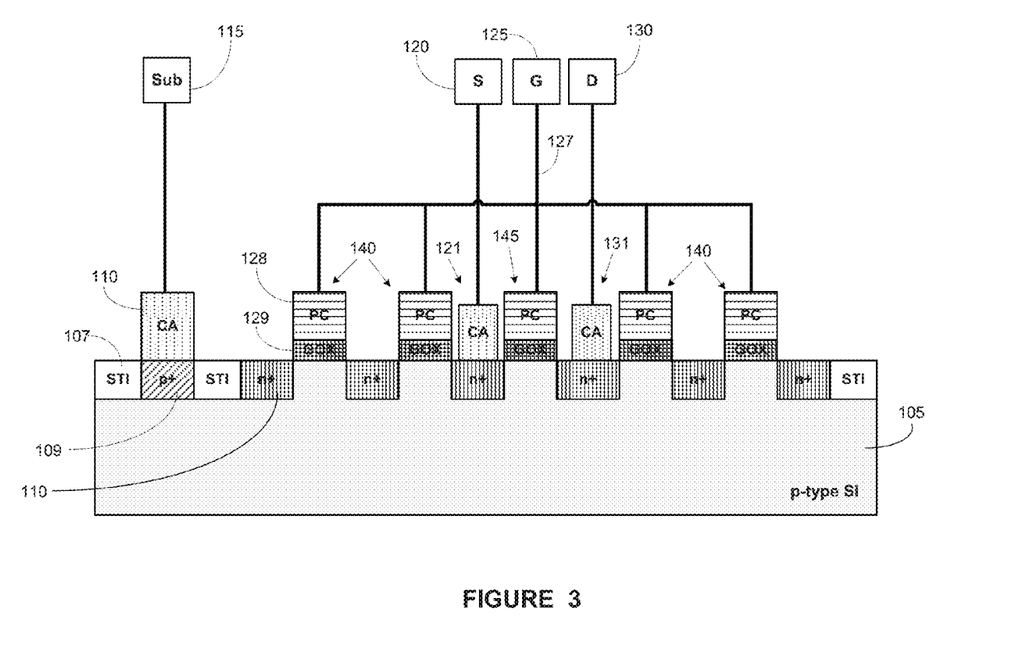
FIG. 3 depicts a stylized depiction of an integrated circuit device comprising a transistor with one or more inactive or dummy gates, in accordance with some embodiments herein.

Turning now to FIG. 3, a stylized depiction of an integrated circuit device comprising a transistor with one or more inactive or dummy gates, in accordance with some embodiments herein, is illustrated. FIG. 3 illustrates a field-effect transistor (FET) that is formed on a substrate 105, e.g., a p-type silicon substrate. Various shallow trench isolation (STI) 107 regions are formed on the substrate 105. Various STI regions 107 may be formed using oxide depositions within the substrate 105. In order to form a device, such as a transistor, at least one p+ doped region 109, as well as n+ doped regions 122 are formed within the substrate 105.

A plurality of gate regions may be formed on the substrate 105. In one embodiment, one active gate and one or more inactive or dummy gates are formed on the substrate 105. In order to form the plurality of gates structures, a plurality of polysilicon conductors (PC) 128 may be formed above respective gate oxide regions (GOX) 129. The active gate 145 is formed adjacent a source region 121 and a drain region 131. In this manner an active gate region 145 is formed, along with dummy gates regions 140. The example of FIG. 3 illustrates an active gate region 145 and four dummy gate regions 140. The number of dummy gate regions 140 that are formed may be tailored to the desired antenna ratio. For example, if a lower antenna ratio is desired, a larger number of dummy gate regions 140 may be formed (see Equation 1 above).

A contact region (CA) 110 may be formed above the doped n+ region 110 adjacent the active gate 145 in order to form the source region 121 of the transistor. Similarly another CA 110 may be formed on an n+ region 110 adjacent the active gate region 145 in order to form a drain region 131 of the transistor. Further, a CA 110 may be formed above the p+ doped region 109. A test substrate pad 115 may be connected to the contact 110. A source test pad 120 may be connected to the source region 121, a drain test pad 130 may be connected to the drain region 131, and a gate test pad 125 may be connected to the dummy gates 140 as well as to the active gate 145. The equivalent circuit provided by the structure illustrated in FIG. 3 is depicted in FIG. 4.

Figure 4:
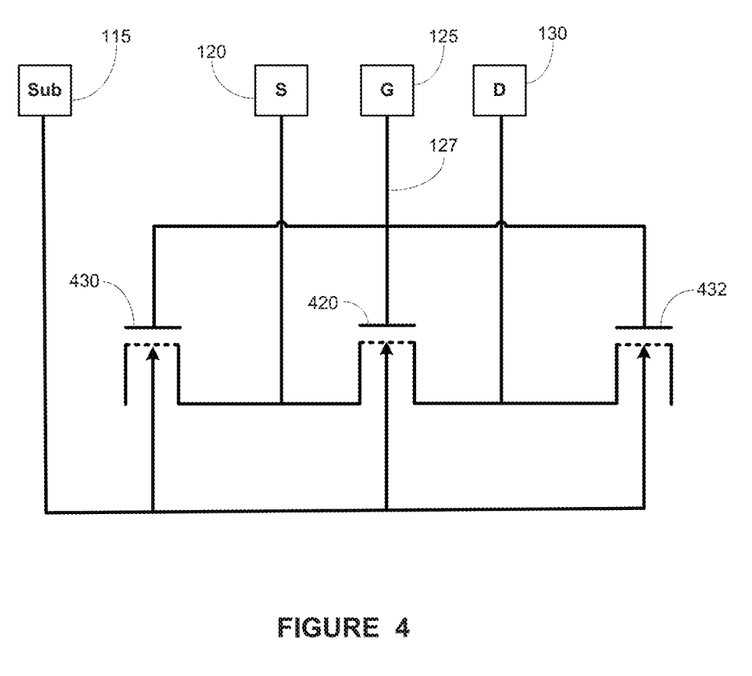
FIG. 4 illustrates a stylized equivalent circuit diagram of the structure of FIG. 3 in accordance with some embodiments herein.

Turning now to FIG. 4, a stylized equivalent circuit diagram of the structure of FIG. 3 in accordance with some embodiments herein, is illustrated. As indicated in FIG. 4, the structure of FIG. 3 comprises an active gate 420 that corresponds to the PC and GOX structures indicated by reference number 145 in FIG. 3. Moreover, FIG. 4 also shows a first inactive or dummy gate 430 and a second dummy gate 432. The dummy gates 430, 432 correspond to the PC and GOX structures indicated by the reference number 140 in FIG. 3. As indicated in FIG. 4, the inactive or dummy gates 460, 432 are positioned in parallel to the active gate 420. Only two dummy gates are illustrated for clarity, however, those skilled in the art would appreciate that additional dummy gates may be added and remain within the spirit and scope of embodiments herein.

The inactive or dummy gates 430, 432 may provide protection from charge, such as plasma processing charges. The inactive or dummy gates 430, 432, although not active in the circuit with respect to transistor-specific operations, may dissipate at energy from charge experienced by the circuit from one of various sources. Plasma processing may cause the substrate 105 to experience charge during processing. The dummy gates 430, 432, may dissipate at least a portion of these charges. In some cases, after the circuit formed on the substrate 105 and are distributed for usage, energy from external sources (electrical field) may cause the circuit to experience excessive charge. The dummy gate 430, 432 may dissipate at least a portion of these charges.

Moreover, the dummy gates 430, 432 are capable of providing flexibility in antenna rules associated with the manufacturing of transistors. A predetermined antenna ratio can be implemented when manufacturing transistors in the manner described herein. For example, if additional metal connections are desired in the transistor, a predetermined antenna may be maintained by increasing the number of dummy transistors that are formed. In this manner, the manufacturing of transistors may be influenced by the context in which the transistors may be tested or used in circuits, wherein higher or lower number of dummy transistors may be formed based upon the testing or usage context.

Figure 5:
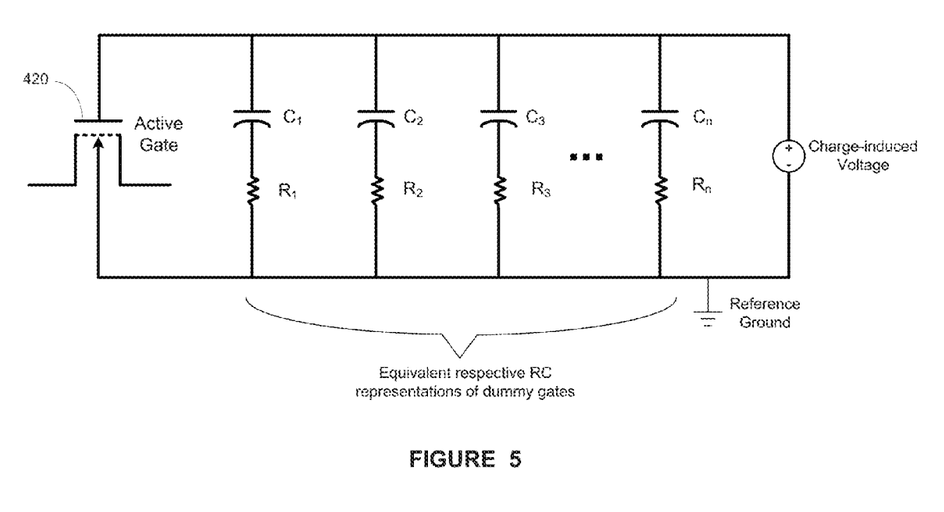
FIG. 5 illustrates a stylized representation of an equivalent circuitry of an active gate and a plurality of capacitances relating to inactive gates, in accordance to some embodiments herein.

Turning now to FIG. 5, a simplified, stylized representation of an equivalent circuitry of an active gate and a plurality of capacitances relating to inactive gates, in accordance to some embodiments, is illustrated. In one embodiment, external charge experienced by a transistor may be dissipated (at least in part) by the equivalent capacitance of an inactive/dummy gate. FIG. 5 illustrates an active gate 420 in parallel with: a first capacitance $C_1$ and a first resistance $R_1$, which represents an equivalent capacitance and resistance of a first dummy gate; a second capacitance $C_2$ and a second resistance $R_2$, which represents an equivalent capacitance and resistance of a second dummy gate; a third capacitance $C_3$ and a third resistance $R_3$, which represents an equivalent capacitance and resistance of a third dummy gate, through an $n^{th}$ capacitance $C_n$ and an $n^{th}$ resistance $R_n$, which represents an equivalent capacitance and resistance of an $n^{th}$ dummy gate.

The exemplary circuit of FIG. 5 may experience a charge-induced voltage (e.g., caused by a plasma process or an external electrical field) relative to a reference ground. Each of capacitor associated with a dummy gate (e.g., $1^{st}$ dummy gate) may be capable of dissipating at least a portion of a charge-induced voltage. The oxide voltage (Vox) may be determined by the plasma charge collected by a particular gate, as indicated by Equation 2.

$$Vox = Q/Cox; \qquad \text{Eq. 2}$$

wherein, Q is the plasma charge collected by a gate and Cox is the oxide capacitance. Generally, the dissipation of the plasma charge is driven by the tunneling current through the equivalent gate capacitor. For example, the tunneling current, Ig, may be modeled using a power law characteristic defined by Equation 3.

$$Ig = \text{Gate Area} * \text{pre-factor} * (Vox)^{\alpha} \qquad \text{Eq. 3}$$

The higher the tunneling current, Ig, the greater the dissipation of the plasma charge. Therefore, a greater number of dummy gates would result in a larger amount of tunneling current that would be able to dissipate plasma charge. The oxide voltage Vox in equilibrium will occur when the plasma current is equal to the tunneling current of the active gates in combination with the dummy gates. Similarly, the $2^{nd}$ through $n^{th}$ dummy gates may also contribute to the dissipation of the charge-induced voltage in a similar fashion. Therefore, the greater the number of inactive/dummy gates, the greater is the ability of the transistor to dissipate charge-induced energy. Accordingly, the greater the number of inactive/dummy gates, the higher the electrical protection afforded to the transistor.

Figure 6:
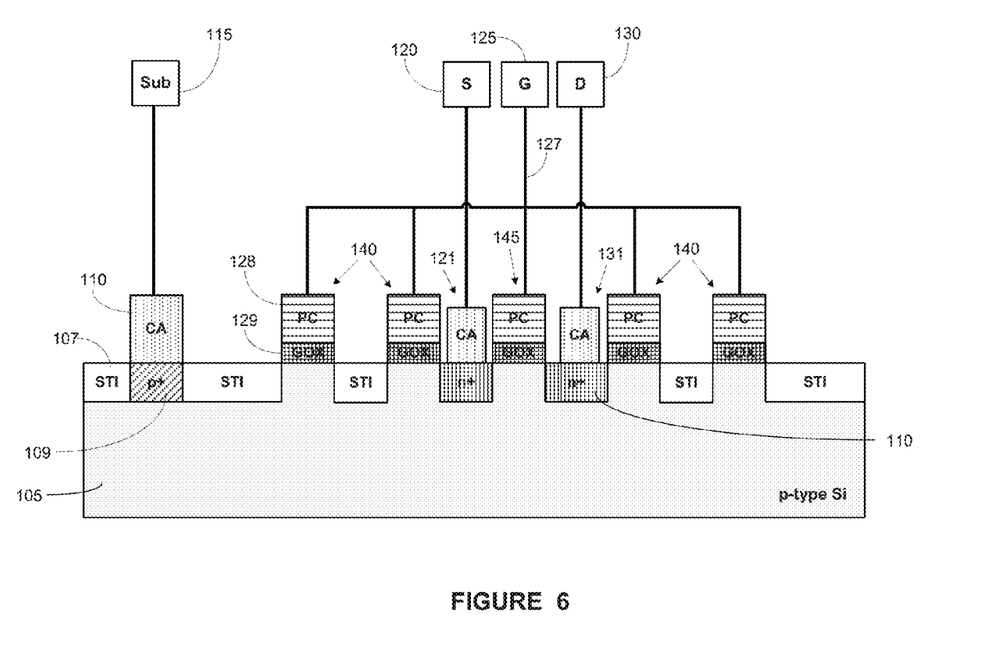
FIG. 6 illustrates a stylized depiction of an integrated circuit device comprising a transistor with one or more inactive or dummy gates, in accordance with an first alternative embodiment.

Turning now to FIG. 6, a stylized depiction of an integrated circuit device comprising a transistor with one or more inactive or dummy gates, in accordance with a first alternative embodiment, is illustrated. FIG. 6 illustrates a FET that is formed on a substrate 105, e.g., a p-type silicon substrate, similar to the substrate illustrated in FIG. 3. Various shallow trench isolation (STI) 107 regions are formed on the substrate 105. Various STI regions 107 may be formed using oxide depositions on the substrate 105. In order to form a device, such as a transistor, at least one p+ doped region 109, as well as n+ doped regions 122 are formed are formed on the substrate 105.

A plurality of gate regions may be formed on the substrate 105. In one embodiment, one active gate and one or more inactive or dummy gates are formed on the substrate 105. Similar to the substrate descriptions with respect to FIG. 3 provided above, in order to form the plurality of gates, a plurality of polysilicon conductors (PC) 128 may be formed above respective gate oxide regions (GOX) 129. An active gate region 145 and inactive, dummy gates regions 140 are formed on the substrate 105. An active gate region 145 and four dummy gate regions 140 may be formed on the substrate 105. However, in as shown in FIG. 6, at the regions adjacently beneath the inactive gates 140, instead of forming n+ doped regions as exemplified in FIG. 3, STI areas are formed instead. Reducing the doped n+ regions in the substrate 105 may provide for less charge carriers, which may result in lower leakage currents.

A contact region (CA) 110 may be formed above the doped n+ region 110 to form a source region 121 of the transistor. Similarly, another CA 110 may be formed on an n+ region 110 to form a drain region 131 of the transistor. Further, a CA 110 may be formed above the p+ doped region 109. A test substrate pad 115 may be connected to the contact 110. A source test pad 120 may be connected to the source region 121, a drain test pad 130 may be connected to the drain region 131, and a gate test pad 125 may be connected to the dummy gates 140 as well as to the active gate 145. The test pads 115, 120, 125, and 130 may be connected to test circuitry to perform various tests relating to the operation of the transistor. The circuit provided by the structure illustrated in FIG. 6 is similar to the circuit depicted in FIG. 4.

The total number of dummy gate regions 140 that are formed may be tailored to the desired antenna ratio. For example, if a lower antenna ratio is desired, a larger number of dummy gate regions 140 may be formed (see Equation 1 above).

Figure 7:
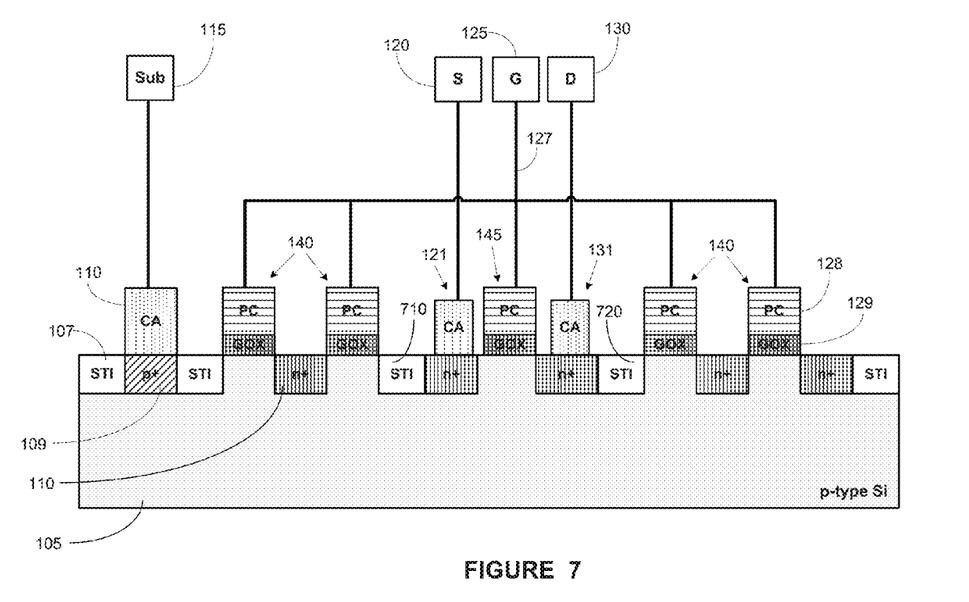
FIG. 7 illustrates a stylized depiction of an integrated circuit device comprising a transistor with one or more inactive or dummy gates, in accordance with a second alternative embodiment.
Figure 8:
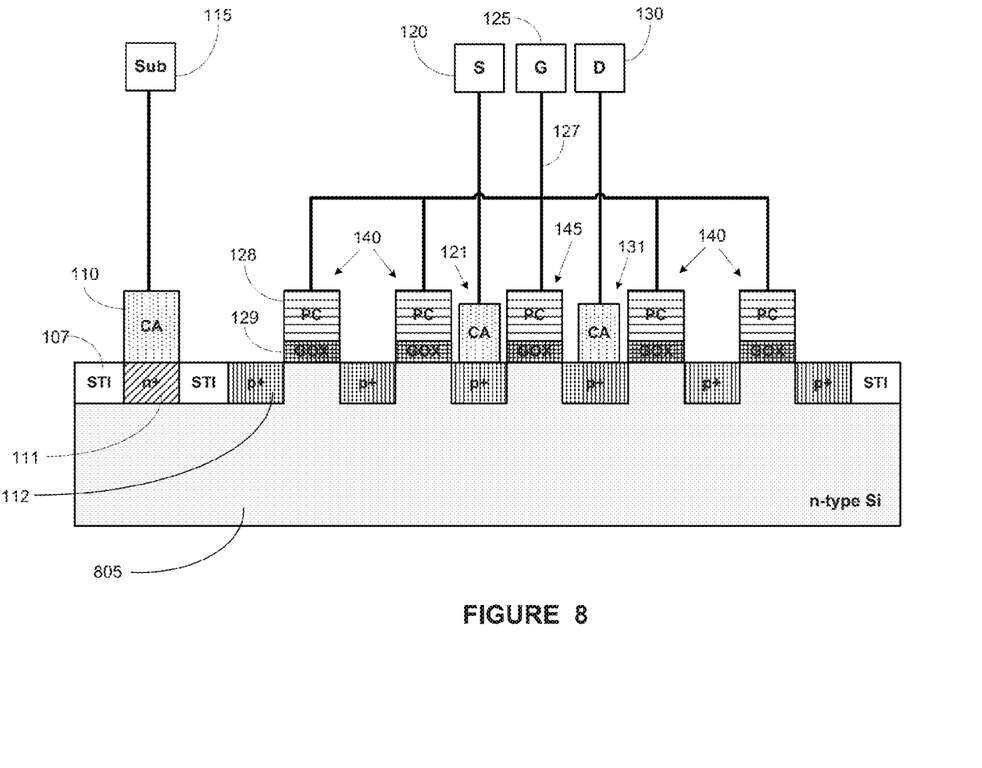
FIG. 8 illustrates a stylized depiction of an integrated circuit device comprising a transistor with one or more inactive or dummy gates, in accordance with a third alternative embodiment.

Turning now to FIG. 7, a stylized depiction of an integrated circuit device comprising a transistor with one or more inactive or dummy gates, in accordance with a second alternative embodiment, is illustrated. The substrate 105 and the features formed on the substrate 105 of FIG. 7 are similar to the features formed on the substrate illustrated in FIG. 3. However, the inactive/dummy gates 140 formed on the substrate 105 of FIG. 7 are formed beyond the STI features 710 and 720. As shown in FIG. 8, the inactive gates 140 of FIG. 7 are isolated between STI features, which may provide for a reduction in leakage currents. The circuit provided by the structure illustrated in FIG. 7 is similar to the circuit depicted in FIG. 4.

Turning now to FIG. 8, a stylized depiction of an integrated circuit device comprising a transistor with one or more inactive or dummy gates, in accordance with a third alternative embodiment, is illustrated. The features shown in FIG. 8 is similar to the features formed on the substrate illustrated in FIG. 3; however, the substrate 805 of FIG. 8 is an n-type substrate.

FIG. 8 illustrates a FET that is formed on an n-type substrate 805. Various shallow trench isolation (STI) 107 regions are formed on the substrate 105. In order to form a device, such as a transistor, a p+ doped region 112, as well as n+ doped regions 111 are formed are formed on the substrate 105.

Similar to the circuit of FIG. 3, with regard to FIG. 8, a plurality of gate regions may be formed on the substrate 805. In one embodiment, one active gate and one or more inactive or dummy gates are formed on the substrate 805. A contact region (CA) 110 may be formed above the doped p+ region 112 to form a source region 121 of the transistor. Similarly, another CA 110 may be formed on a p+ region 112 to form a drain region 131 of the transistor. Further, a CA 110 may be formed above the n+ doped region 111. A test substrate pad 115 may be connected to the contact 110. The source test pad 120 may be connected to the source region 121, the drain test pad 130 may be connected to the drain region 131, and the gate test pad 125 may be connected to the dummy gates 140 as well as to the active gate 145. The circuit provided by the structure illustrated in FIG. 8 is similar to the circuit depicted in FIG. 4.

In an alternative embodiment, the active gate region 145 of FIG. 8 may represent two gate regions separated by a dielectric layer, such as an inter-poly dielectric oxide-nitride-oxide (ONO). For example, the active gate region 145 may comprise a control gate over an inter-poly dielectric ONO layer, which may be formed over a floating gate that is formed above a tunnel oxide layer over a silicon substrate. This arrangement may be used in Flash technology devices. In this embodiment, one or more inactive gate regions may be formed in parallel to both gates that represent the "active gate" 145.

Figure 9:
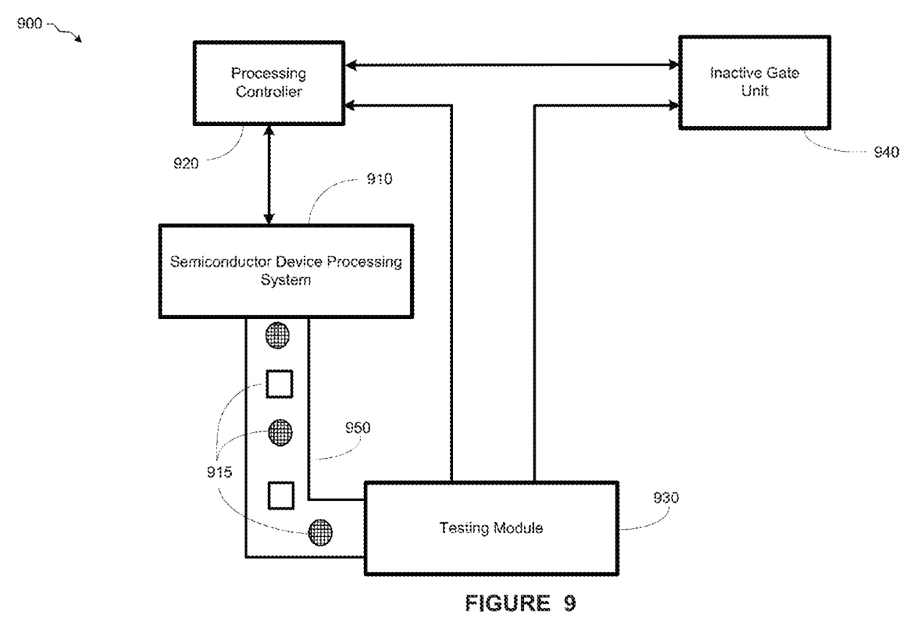
FIG. 9 illustrates a system in accordance for processing a semiconductor wafer for forming an integrated circuit, in accordance with some embodiments herein.

Turning now to FIG. 9, a system 900 for processing a semiconductor wafer for forming an integrated circuit, in accordance with some embodiments herein, is illustrated. The system 900 may comprise a semiconductor device processing system 910. The semiconductor device processing system 910 may comprise various processing stations, such as etch process stations, photolithography process stations, CMP process stations, etc.

One or more of the processing steps performed by the processing system 910 may be controlled by the processing controller 920. The processing controller 920 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc. The processing controller 920 is capable for controlling process steps to manufacture integrated circuits similar to the manner exemplified in FIGS. 3 and 6-8.

The semiconductor device processing system 910 may produce integrated circuits on a medium, such as silicon wafers. The processing system 910 may provide processed integrated circuits/devices 915 on a transport mechanism 950, such as a conveyor system. In some embodiments, the conveyor system may be sophisticated clean room transport systems that are capable of transporting semiconductor wafers. In one embodiment, the semiconductor device processing system 910 may comprise a plurality of processing sets, e.g., the $1^{st}$ process step, the $2^{nd}$ process set, etc., as described above.

In some embodiments, the items labeled "915" may represent individual wafers, and in other embodiments, the items 915 may represent a group of semiconductor wafers, e.g., a "lot" of semiconductor wafers. The system 900 may also comprise a testing module for performing one or more tests on the integrated circuit. For example, the pads (115, 120, 125, and 130) described in FIGS. 3 and 6-8 may be attached to transistors formed by the processing system 910 for testing. Electrical signals may be sent and monitored via the pads (115, 120, 125, and 130) to test the operation of the transistor. In some embodiments, feedback provided by the testing module 930 may be used to adjust subsequent process steps to adjust the performance of transistors subsequently manufactured.

In some embodiments, the feedback may not be on an immediate, wafer-to-wafer basis, but may be based upon a lot-to-lot basis. The testing module 930 may also be capable of determining a change from one wafer to another within a lot. In many embodiments, the testing module provides test data that may be used by the processing controller 920 to modify one or more process parameters relating to a subsequent lot of semiconductor wafers.

In one embodiment, the system 900 may also comprise an inactive gate unit 940. The inactive gate unit 940 may be capable of determining the number of dummy/inactive gates that should be formed when manufacturing an integrated circuit, such as a transistor. The inactive gate unit 940 unit may utilize various factors in determining the number of inactive gates that should be formed. For example, the desired antenna ratio may be a factor in determining the number of inactive gates to be formed. Other factors include the antenna ratio requested by a customer of the integrated circuit, the likely usage of the integrated circuits, etc. Other factors in determining the number of inactive gates to form include the amount of charge dissipation required by the likely exposure to external change-inducing sources that the integrated circuits will experience. In some cases, feedback from the testing module 940 may be used to influence the number of inactive gates that may be formed. Various other factors known to those skilled in the art having benefit of the present disclosure may be used to determine the number of inactive gates to form in an integrated circuit, and remain within the spirit and scope of the present invention. In an alternative embodiment, the inactive gate unit 940 may be integrated into the processing controller 920.

The system 900 may be capable of manufacturing and testing various products that include transistors with active and inactive gates involving various technologies. For example, the system 900 may provide for manufacturing and testing products relating to CMOS technology, Flash technology, BiCMOS technology, power devices, memory devices (e.g., DRAM devices), NAND memory devices, and/or various other semiconductor technologies.

Figure 10:
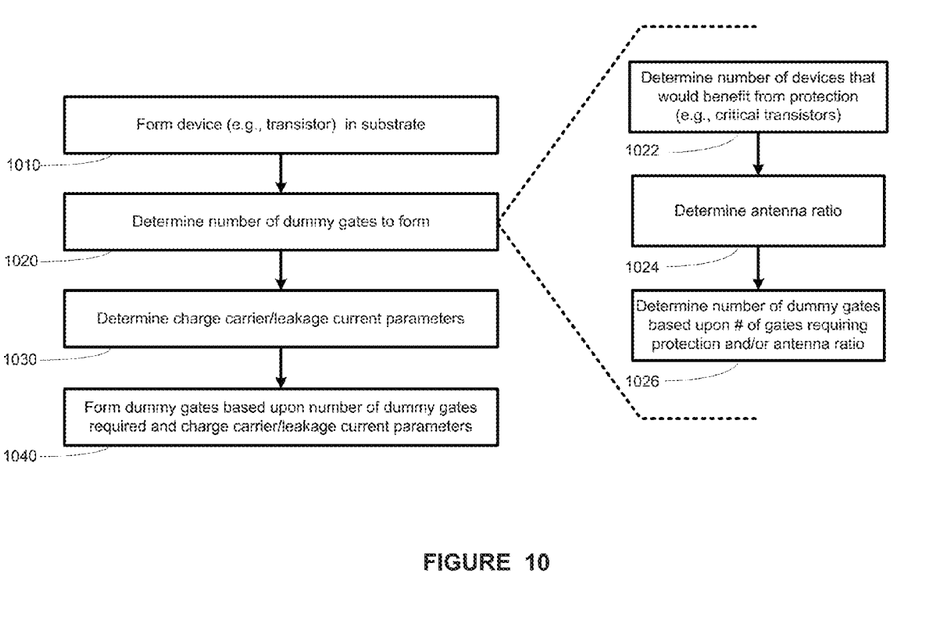
FIG. 10 illustrates a flowchart depiction of a method for fabricating an integrated device comprising an inactive gate, in accordance with embodiments herein.

Turning now to FIG. 10, a flowchart depiction of a method for fabricating an integrated device comprising an inactive gate, in accordance with embodiments herein is illustrated. An integrated circuit, such as a transistor, is formed on a substrate (block 1010). As exemplified above in FIG. 3, 6-8, various features, such as an n+ dopant region, a p+ dopant region, gate oxide regions, metal formations, etc., are formed on an p-type or an n-type substrate. When forming the integrated circuit, e.g., transistor, a process of determining a number of dummy/inactive gates to be formed is performed (block 1020).

The process of determining the number for inactive gates to be formed may include determining the number of transistors on a device that would benefit from protection provided by inactive gates (block 1022). These transistors may be include critical transistors that may be intended for sensitive control or communications tasks. In some examples, these critical transistors may include the integrated circuit that may be used in medical devices or critical communications; therefore, reliability of the transistors may be important. The number of inactive gates may also be determined using the desired, prescribed, or predetermined antenna ratio (block 1024). In alternative embodiments, the number of inactive gates that are formed may influence antenna rules, e.g., relaxation of antenna ratio.

In some cases, the customer of the processed device may specify larger antenna ratio tolerance, which may prompt the processing control to increase the number of inactive gates that are formed. Using information with respect to determining the number of gates requiring protection and/or the desired antenna ratio, the number of dummy/inactive to gate to be formed may be determined (block 1026). Further, the charge carrier/leakage current or voltage parameters are determined (block 1030). Based upon the number of gates determined in step 1020 and/or the charge carrier/leakage parameters of step 1030, inactive gates are formed on the substrate along with the active gate (block 1040).

Figure 11:
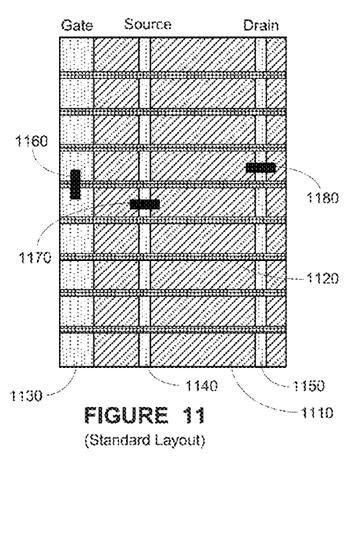
FIG. 11 illustrates a stylized representation of a substrate layout comprising metal lines formed for manufacturing a transistor, in accordance with a standard layout
Figure 12:
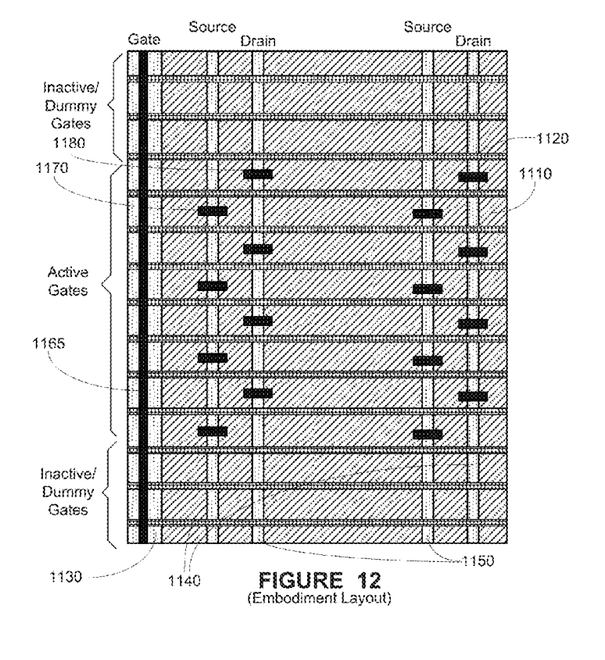
FIG. 12 illustrates a stylized representation of a substrate layout comprising metal lines formed for manufacturing a transistor, in accordance with a layout with respect to embodiments herein.

FIG. 11 illustrates a stylized representation of a substrate layout comprising metal lines formed for manufacturing a transistor, in accordance with a standard layout. FIG. 12 illustrates a stylized representation of a substrate layout comprising metal lines formed for manufacturing a transistor, in accordance with a layout with respect to embodiments herein. Referring simultaneously to FIGS. 11 and 12, substrate layouts with one or more transistors are shown. FIGS. 11 and 12 illustrate a substrate 1110 (e.g., p-type substrate) upon which various structures are formed. For example, a plurality of horizontal metal lines 1120 are formed across the substrate 1110. On another layer a gate region 1130, a source region 1140, and a drain region 1150 may be formed in order to manufacture a transistor. Metal connections (e.g., vias) may be formed to make appropriate connections to develop the source, drain and gate region in order to form a transistor.

FIG. 11 illustrates a metal connection 1160 formed over the gate region 1130, a metal connection 1170 formed over the source region 1140, and a metal connection 1180 formed over the drain region 1150. In this manner, a standard layout for a transistor is provided. In contrast, FIG. 12 illustrates a metal connection 1165 over a plurality of metal lines over the gate region 1130. However, a lesser number of metal connections over the source and drain regions are provided in FIG. 12. In the exemplary layout of FIG. 12, a plurality of metal connections 1170 are formed over a plurality of source regions 1140. Similarly, a plurality of metal connections 1180 are formed over a plurality of drain regions 1140. These connections form a plurality of transistor.

As illustrated in FIG. 12, not all gate connections are used to form transistors. FIG. 12 illustrates a greater number of gates regions than corresponding source and drain regions. That is, FIG. 12 shows that several gate regions do not have corresponding source and drain regions. These "unpaired" gate regions serve as dummy/inactive gates. The region that comprises metal connections 1160, 1170, 1180 over the gate, source and drain regions (1130, 1140, 1150) form active gates, as indicated by the area labeled "Active Gates" in FIG. 12. The region that comprises only metal connection 1160 over the gate region 1130, but no corresponding metal connections of the source and drain regions 1140, 1150 form inactive or dummy gates., as indicated by the area labeled "Inactive/Dummy Gates" in FIG. 12. In this manner, active and inactive gates are formed on the substrate 1110 in accordance with embodiments herein. The inactive gates provide for protection for the transistors from various parasitic electrical characteristics, such as parasitic charge.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a transistor, comprising:
    forming a source region on a substrate, comprising forming a first n+dopant region on a p-type substrate and forming a first contact region above said first n+dopant region;
    forming a drain region on said substrate adjacent said active gate region, comprising forming a second n+dopant region on said p-type substrate and forming a second contact region above said second n+dopant region;
    forming an active gate region on said substrate adjacent said source region, comprising forming a first gate oxide region above said p-type substrate between said first and second n+dopant regions and forming a first polysilicon conductor region above said first gate oxide region; and
    forming a first inactive gate region on said substrate in parallel to said active gate region, comprising forming a second gate oxide region above said p-type substrate adjacent said first n+dopant region, forming a second polysilicon conductor region above second first gate oxide region, and electrically coupling said second polysilicon conductor region to said first polysilicon conductor region, wherein said source region, said drain region, said active gate region, and said first inactive gate region comprise said transistor, and wherein said first inactive gate region is capable of dissipating at least a portion of a charge.

2. The method of claim 1, further comprising:
    forming a third n+dopant region on said p-type substrate adjacent said second gate oxide region;
    forming a shallow trench isolation region adjacent said third n+dopant;
    forming a p+dopant region on said p-type substrate adjacent said shallow trench isolation region; and
    forming a third contact region above said p+dopant region.

3. The method of claim 2, further comprising
    coupling electrically a source pad to said source region;
    coupling electrically a gate pad to said gate region; and
    coupling electrically a drain pad to said drain region;
    wherein said source, gate and drain pads are capable providing for testing of said transistor.

4. The method of claim 1, wherein said first inactive gate region is further capable of at least partially dissipating said charge resulting from a plasma process.

5. The method of claim 1, further comprising forming a second inactive gate region on said substrate in parallel to said first inactive gate, wherein said second inactive gate is capable of dissipating said at least a portion of said charge.

6. A method for forming a transistor, comprising:
    forming a source region on a substrate, comprising forming a first p+dopant region on an n-type substrate and forming a first contact region above said first p+dopant region;
    forming a drain region on said substrate adjacent said active gate region, comprising forming a second p+dopant region on said n-type substrate and forming a second contact region above said second p+dopant region;
    forming an active gate region on said substrate adjacent said source region, copmprsing forming a first gate oxide region above said n-type substrate between said first and second p+dopant regions and forming a first polysilicon conductor region above said first gate oxide region; and
    forming a first inactive gate region on said substrate in parallel to said active gate region, comprising forming a second gate oxide region above said n-type substrate adjacent said first p+dopant region, forming a second polysilicon conductor region above second first gate oxide region, and electrically coupling said second polysilicon conductor region to said first polysilicon conductor region, wherein said source region, said drain region, said active gate region, and said first inactive gate region comprise said transistor, and wherein said first inactive gate region is capable of dissipating at least a portion of a charge.

7. The method of claim 6, further comprising:
    forming a third p+dopant region on said n-type substrate adjacent said second gate oxide region;
    forming a shallow trench isolation region adjacent said third p+dopant;
    forming a n+dopant region on said n-type substrate adjacent said shallow trench isolation region; and
    forming a third contact region above said n+dopant region.

8. The method of claim 7, further comprising
    coupling electrically a source pad to said source region;
    coupling electrically a gate pad to said gate region; and
    coupling electrically a drain pad to said drain region;
    wherein said source, gate and drain pads are capable providing for testing of said transistor.

9. The method of claim 6, wherein said first inactive gate region is further capable of at least partially dissipating said charge resulting from a plasma process.

10. The method of claim 6, further comprising forming a second inactive gate region on said substrate in parallel to said first inactive gate, wherein said second inactive gate is capable of dissipating said at least a portion of said charge.

11. A method for forming a transistor, comprising:
    forming a source region on a substrate;
    forming an active gate region on said substrate adjacent said source region;
    forming a drain region on said substrate adjacent said active gate region; and
    determining an antenna ratio for said transistor and
    forming a first inactive gate region in response to said antenna ratio on said substrate in parallel to said active gate region, wherein said source region, said drain region, said active gate region, and said first inactive gate region comprise said transistor; and said first inactive gate region is capable of dissipating at least a portion of a charge.

12. The integrated circuit device comprising:
a transistor, comprising:
a source region on a p-type substrate; wherein said source region comprises a first n+dopant region and first contact region above said first n+dopant region;
an active gate region on said substrate adjacent said source region, wherein said active gate region comprises a first gate oxide region formed between said first and second n+dopant regions and a first polysilicon conductor region above said first gate oxide region;
a drain region on said substrate adjacent said active gate region, wherein said drain region comprises a second n+dopant region and a second contact region above said second n+dopant region;
an inactive gate region on said substrate in parallel to said active gate region, wherein said inactive gate region is capable of dissipating at least a portion of a charge, said first inactive gate region comprises a second gate oxide region adjacent said first n+dopant region, a second polysilicon conductor region above second first gate oxide region, and said second polysilicon conductor region is electrically coupled to said first polysilicon conductor region.

13. The integrated circuit device of claim 12, further comprising:
a third n+dopant region adjacent said second gate oxide region;
a shallow trench isolation region adjacent said third n+dopant;
a p+dopant region adjacent said shallow trench isolation region; and
a third contact region above said p+dopant region.

14. The integrated circuit device of claim 12, further comprising
a source pad coupled electrically to said source region;
a gate pad coupled electrically to said gate region; and
a drain pad coupled electrically to said drain region;
wherein said source, gate and drain pads are capable providing for testing of said transistor.

15. The integrated circuit device of claim 12, further comprising a plurality of inactive gates in parallel to said active gate, wherein the number inactive gates are based upon at least one of:
a predetermined antenna ratio for said transistor;
a leakage current parameter for said active gate; and
a criticality of said active gate.

16. The integrated circuit device of claim 12, wherein said charge is at least one of a leaked charge from a plasma process, or a charge from an external electrical field.

* * * * *